United States Patent
Van Wyk et al.

(10) Patent No.: US 8,598,885 B2
(45) Date of Patent: Dec. 3, 2013

(54) INSTRUMENTATION CIRCUIT FOR SHUNT-BASED METROLOGY MEASUREMENT

(76) Inventors: Hartman Van Wyk, Mont Louis sur Loire (FR); Youcef Haddab, Paris (FR); Jean-Jacques Dormard, Paris (FR)

( * ) Notice: Subject to any disclaimer, the term of this patent is extended or adjusted under 35 U.S.C. 154(b) by 0 days.

(21) Appl. No.: 13/275,841

(22) Filed: Oct. 18, 2011

(65) Prior Publication Data

US 2013/0093435 A1    Apr. 18, 2013

(51) Int. Cl.
    *G01R 31/08*    (2006.01)
(52) U.S. Cl.
    USPC .......................... 324/522; 324/649; 324/713
(58) Field of Classification Search
    USPC ........ 324/522, 713, 555, 76.11; 327/345, 335
    See application file for complete search history.

(56) References Cited

U.S. PATENT DOCUMENTS

| | | | |
|---|---|---|---|
| 4,053,832 A | 10/1977 | Nelson | |
| 4,359,684 A | 11/1982 | Ley | |
| 6,636,098 B1 * | 10/2003 | Kizer | 327/345 |
| 7,242,177 B2 | 7/2007 | Maier et al. | |
| 2002/0097033 A1 | 7/2002 | Duijkers et al. | |
| 2003/0169051 A1 | 9/2003 | Tallman et al. | |
| 2006/0192544 A1 | 8/2006 | Huang | |

OTHER PUBLICATIONS

PCT International Search Report for PCT International Application No. PCT/US11/62821; International Search completed Mar. 23, 2012, Report mailed Apr. 3, 2012.
PCT Written Opinion of the International Searching Authority for PCT International Application No. PCT/US11/62821; opinion completed Mar. 23, 2012, opinion mailed Apr. 3, 2012.
Jan. 31, 2012 Office Action issued in Canadian Patent Application No. 2,755,382.

* cited by examiner

*Primary Examiner* — Vincent Q Nguyen
(74) *Attorney, Agent, or Firm* — Lee & Hayes, PLLC

(57) ABSTRACT

Current flow at a line frequency may be measured from a source using matched voltage drops in a pair of voltage drop circuits. The voltage drop circuits may each includes a fixed value component, such as a resistor, and an adjustable value component, such as an adjustable current source, coupled in series. The adjustable valued components may be controlled based on differences in voltage drops produced by the voltage drop circuits based on a high-frequency signal, higher in frequency than the line frequency, applied to a control input for each of the adjustable value components.

21 Claims, 2 Drawing Sheets

INSTRUMENTATION CIRCUIT FOR SHUNT-BASED METROLOGY MEASUREMENT

FIELD OF THE SUBJECT MATTER

The present subject matter relates to metrology in both single and polyphase environments. More particularly, the present subject matter relates to improvements in methods and apparatus for enabling measurement of small value differential voltages around large common mode values in shunt-based current measurement circuits.

BACKGROUND OF THE SUBJECT MATTER

Utility providers employ various meters and corresponding measurement circuitry to monitor the amount of electrical energy generated by or distributed to various service locations. Such locations may be respectively characterized by one of many different single-phase or polyphase service types, corresponding to such common operating voltages as 120, 240, 277 and 480 volts (RMS). Some known electricity meters have been designed to function at all or a number of such common metering voltages, and are thus operable over a wide input voltage range. Due to industry standards that often require meter accuracy at a range from about twenty percent below the minimum metered voltage value to about twenty percent above the maximum metered voltage value, meters operable in a full wide input voltage range correspond to those that are fully functional in an overall range of about 96 volts to 576 volts (RMS).

Electricity meters typically include some sort of input circuitry for receiving voltage and current signals at the electrical service. Input circuitry for receiving the electrical service current signals is referred to herein as current acquisition circuitry, while input circuitry for receiving the electrical service voltage signals is referred to as voltage acquisition circuitry.

Many different components have conventionally been used in meter voltage current acquisition circuitry, including respective voltage transformer, active current transformer, and resistive voltage divider configurations. Resistive voltage dividers are quite convenient, but may present calibration issues unless precision components are employed. Previous resistive divider configurations have employed adjustable divider configurations including both manually adjustable potentiometer type devices as well as digitally controlled selectable resistor values.

Such resistive voltage dividers may perform satisfactorily for certain instances, but in other environments, such as those requiring a matched voltage division, providing a pair of precisely matched voltage dividers may prove difficult. Further, maintaining a matched division ratio over time may also be an issue due to environmental changes, aging of components, and other considerations.

As such, it is desired to provide shunt voltage measurement circuitry within feasible size and cost constraints, while also providing highly accurate measurement capabilities. While various aspects and alternative embodiments may be known in the field of electricity metering, no one design has emerged that generally encompasses the above-referenced characteristics and other desirable features associated with input circuitry acquisition in an electrical service and associated metering technology.

SUMMARY OF THE SUBJECT MATTER

In view of the recognized features encountered in the prior art and addressed by the present subject matter, improved methodology and apparatus are provided for improved metrology. More specifically, improved subject matter is provided for obtaining highly accurately matched voltage drops in a shunt measurement arrangement.

In one embodiment of the present subject matter, a "matched drop" of voltages is created on each side of the shunt, with the result of bringing the shunt voltage common mode down to values which are more readily handled. Still further, the present subject matter addresses an otherwise significant need for matching accuracy needed by generating an additional signal at high-frequency superimposed on a voltage varying in frequency with the line voltage. With such an approach, per the present subject matter, the resulting mismatch can be measured at such high-frequency and a feedback loop may be used to control current sources that will tune the voltage drop in order to improve the matching to acceptable levels.

Another embodiment of the present subject matter provides improved apparatus and methodology making use of the present concept that matching is the same at high and low frequency, with the result that the presently disclosed matched-drop circuit concepts are thereby matched at frequencies of interest.

Certain present exemplary embodiments disclose corresponding circuitry that may be provided through the use of a single chip with its own power supply, for measuring all shunt voltages in a multi-phase meter, such as all three shunt voltages in a three-phase meter, without any further need for isolation circuitry. The corresponding cost reduction in implementing the present subject matter is substantial as compared with standard shunt-based polyphase implementations.

In certain embodiments of the present subject matter, the additional high-frequency signal utilized can be any other type of more complex signal (for example, pseudo-random or square wave so long as such signals are out of band with respect to the electrical current information), thereby preventing potential tampering by external injection of similar signals.

In still further present exemplary embodiments, a feedback loop based on an HF signal (for example, such as labeled "v" in present FIG. 2) may use the mismatch information garnered at HF to tune the current sources at line frequency, thus compensating the mismatch.

In still further of some present exemplary embodiments, the present subject matter may particularly relate to improvements in polyphase metering. More particularly, certain polyphase embodiments of the present subject matter have the potential for significantly reducing the cost of polyphase metering while maintaining all technical aspects of existing technologies.

The present subject matter relates in pertinent part in one exemplary embodiment to a method for matching voltage drops in paired voltage drop circuits. Such present exemplary method may provide first and second voltage dividers, each comprising a fixed value component and an adjustable value component coupled in series. Preferably, in such exemplary embodiment, the fixed and adjustable valued components are configured for operation at a first frequency. According to such method, the values of the adjustable value components are adjusted based on any difference in voltage drop values produced by the first and second voltage drop circuits due to measured variations in the voltage drops produced by application of a high-frequency signal higher in frequency that the first frequency.

In selected embodiments the fixed value component may comprise a resistor. In additional embodiments, the adjustable value component may comprise an adjustable current source. In particular present embodiments, the high-frequency signal may be a pseudo-random signal and in selected embodiments may further comprise a square wave signal.

The present subject matter also relates to present exemplary methodology for measuring current flow. In such embodiments, a present exemplary method may provide for coupling a current measurement component having first and second terminals in series with a voltage source and a load device, with the voltage source operating a first frequency. Such exemplary method may further call for providing first and second voltage drop circuits each comprising a fixed value component and an adjustable value component coupled in series, coupling the first voltage divider to the first terminal of the current sampling component, and coupling the second voltage divider to the second terminal of the current sampling component.

Such a foregoing exemplary embodiment of present methodology may further provide for superimposing a relatively high-frequency signal onto the voltage drop circuit current source and adjusting the values of the adjustable value components based on any difference in voltage drop values produced by the first and second voltage drop circuits due to measured variations in the voltage drops produced by the high-frequency signal and then measuring the difference in voltage drop produced by the difference in voltage drop values produced by the first and second voltage dividers at the first frequency.

It should be understood by those of ordinary skill in the art that the present subject matter equally encompasses apparatus as well as related and/or associated methodology. For example, one present exemplary apparatus encompasses apparatus for measuring current flow at a first frequency or across a certain bandwidth through a load device. Exemplary present apparatus according to such embodiments may comprise a current sampling component having first and second terminals, and may include first and second voltage drop circuit coupled, respectively, to the first and second terminals of the current sampling component, each voltage divider including a first fixed value component coupled in series with an adjustable value component. Such apparatus also may include a high-frequency signal source coupled to the first terminal of said current sampling component and a tuning circuit configured to monitor voltage drops produced by the first and second voltage dividers from the high-frequency signal source, and to a provide signals to the adjustable value components based on any differences in the voltage drops. Such exemplary apparatus may also include a measurement device coupled to the first and second voltage dividers to measure voltage drop differences at the first frequency.

Additional embodiments of the present subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments and uses of the subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the present subject matter, not necessarily expressed in the summarized section, may include and incorporate various combinations of aspects of features, components, or steps referenced above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
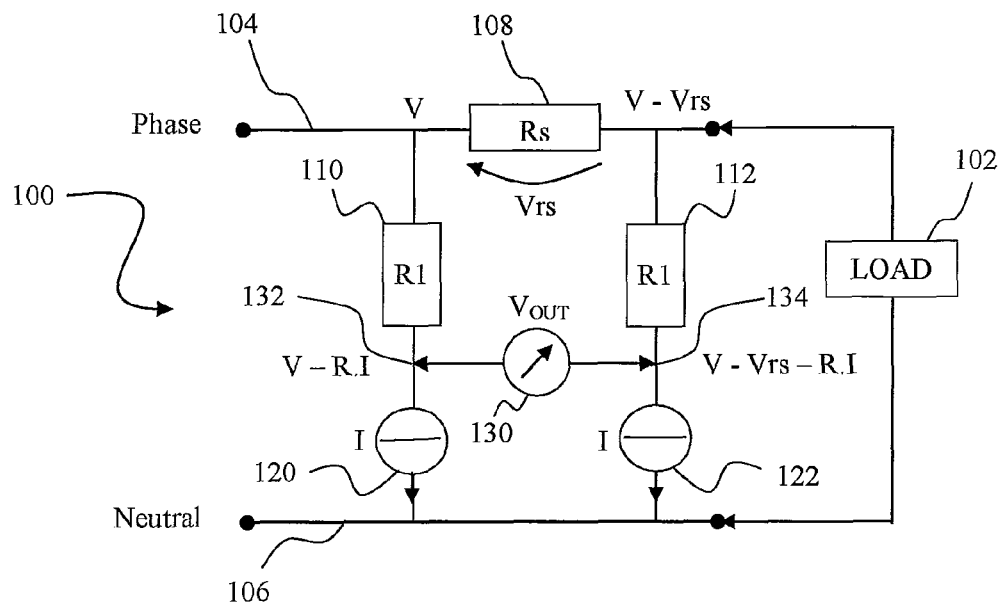
FIG. 1 schematically illustrates a known matched drop circuit for shunt-based metrology measurement, for representing principles of matched drop circuitry for shunt-based metrology measurement.

Repeat use of reference characters throughout the present specification and appended drawings is intended to represent same or analogous features, elements, or steps of the present subject matter.

DETAILED DESCRIPTION OF THE SUBJECT MATTER

As discussed in the Summary of the Subject Matter section, the present subject matter is particularly concerned with providing high accuracy for shunt voltage measurements.

With initial reference to FIG. 1, there is illustrated a known matched drop circuit 100 for shunt-based metrology measurement. As illustrated in circuit 100, a load device 102 may be coupled across phase line 104 and neutral line 106 by way of a high side shunt current sensing resistor (Rs) 108. A voltage measurement circuit is provided corresponding to a pair of resistors (R) 110, 112 connected individually to a pair of current sources (I) 120, 122. As illustrated in FIG. 1, a first end of each resistor 110, 112 is connected to one end of current sensing resistor 108 while the other ends, respectively of resistors 110, 112 are connected to respective current sources 120, 122 that have their respective other terminals connected to neutral line 106.

By the foregoing representative arrangement, and with the basic assumption that the resistive values R of resistors 110 and 112 are identical and the currents produced by current sources 120, 122 are identical, the differential voltage measured by meter 130 across the junctions points 132, 134 of the resistor/current source pairs will correspond exactly to the voltage drop Vrs across current sensing resistor 108. This voltage (Vrs) is very small in value, and sits at a common mode voltage that follows the phase voltage on line 104. In an exemplary configuration, the phase voltage on line 104 may be 340V or more and as such can not be fed to common electronic parts. Those of ordinary skill in the art will appreciate that, contrary to the above-referenced basic assumption, providing such accuracy (of identical values) in resistive values for resistors 110, 112 and in current values for current sources 120,122 is difficult and can not be easily reached in actual practice.

With present reference to subject FIG. 2, a present solution to the above-described matching problem is more fully described with reference to match-drop circuit 200. In accordance with present technology, a solution to the matching problem may be found by providing an active feedback loop control system 240 for the current sources 220, 222, which control system automatically adjusts for differences in the drop devices while it operates to cancel the common mode voltage and bring down Vrs to around the voltage of neutral line 206. In this way, the resulting signal (Vout) can be fed to common electronics.

Figure 2:
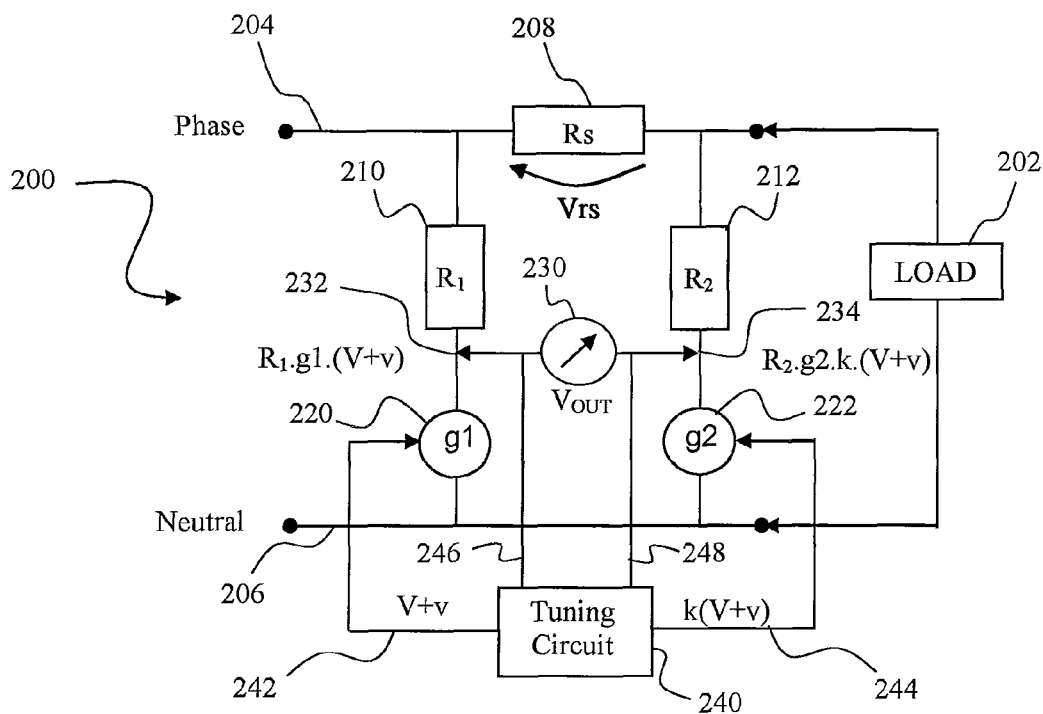
FIG. 2 schematically illustrates a matched drop circuit for shunt-based metrology measurement incorporating current source tuning in accordance with the present technology.

With further reference to FIG. 2, it will be understood by those of ordinary skill in the art that certain circuit aspects of FIG. 2 are in part similar to that of FIG. 1. In particular, a similar arrangement is used in that a load 202 is coupled between a phase line 204 and a neutral line 206 by way of a current sensing resistor (Rs) 208. Similar in part, a pair of voltage drop circuits is provided. In the particular exemplary embodiment of the present subject matter, in the instance of FIG. 2, a representative resistor 210 having a value $R_1$ is coupled in series with a first voltage controlled current source (g1) 220, and a second representative resistor 212 having a value $R_2$ is coupled in series with a second voltage controlled current source (g2) 222.

In accordance with present technology, a tuning circuit 240 is configured to supply control signals via lines 242, 244 to voltage controlled current sources (g1, g2) 220, 222, respectively. Such control signals superimpose a high-frequency signal v on a control voltage V that varies at the same frequency as the network (phase line 204) frequency and is tuned to cancel the common mode voltage. For example, if the network runs at 50 Hz, control voltage V will vary at that same frequency. On top of control voltage V, an additional control voltage v is applied to the voltage controlled current sources (g1, g2) 220, 222 by way of control lines 242, 244. Tuning circuit 240 is configured to monitor the voltage as indicated by meter 230 across the respective junction points 232, 234 of resistor/current source pairs R1/g1 and R2/g2 by way of monitoring connections 246, 248, respectively. The voltage at junction point 232 corresponds to a value of $R_1 g_1(V+v)$ while the voltage at junction point 234 corresponds to a value of $R_2 g_2 k(V+v)$. The information gathered by Tuning circuit 240 by monitoring the voltages at junction points 232, 234 is used to adapt k, the tuning factor, to ensure that the mismatch is always zero.

The matching produced by adjustment of current sources (g1, g2) 220, 222 in accordance with the present subject matter is advantageously the same at both the high and low frequency. Accordingly, per the present technology, the matched-drop circuit is thus matched at the frequencies of interest, i.e., the line frequency of phase line 204 which generally may be 50-60 Hz. Those of ordinary skill in the art will appreciate that the present technology can be easily expanded for use in a three-phase metrology environment. In such instance, a single chip with its own power supply can be configured to measure all three shunt voltages in a three-phase meter. Additional benefits flow from the implementation of the present technology including a significant cost reduction as compared to standard shunt-based polyphase equivalent metering configurations. Further, implementation of the present technology avoids the previous need for isolators to separate measurement circuitry from high voltage levels, and provides a mechanism for providing continuous adjustment of the measurement circuit.

Figure 3:
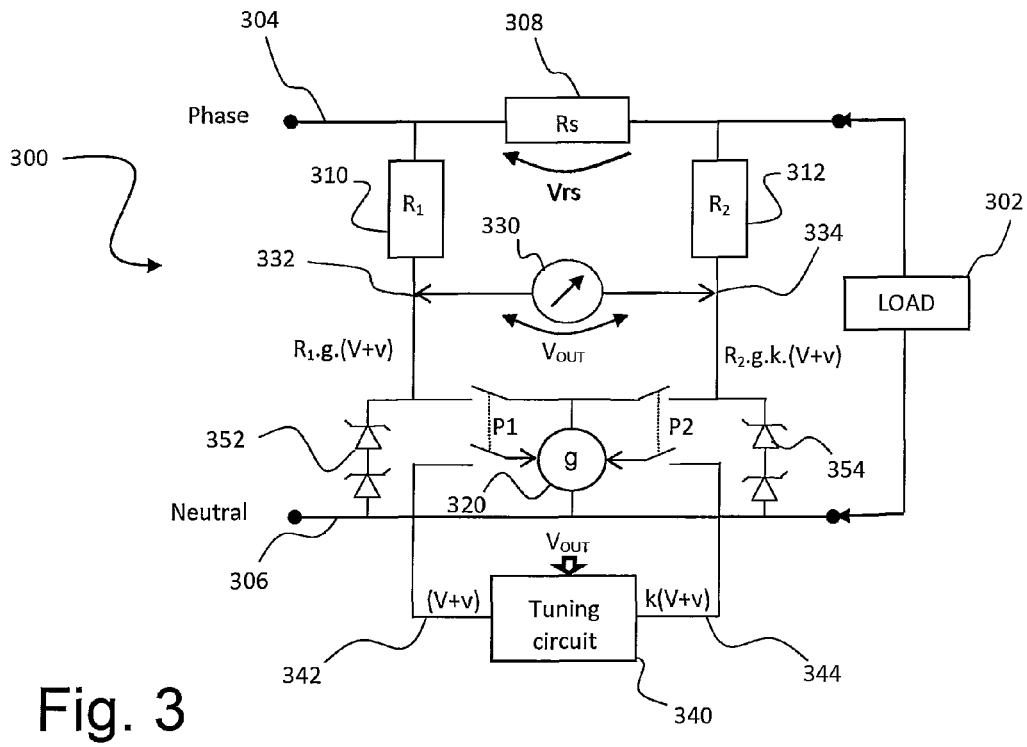
FIG. 3 schematically illustrates a further exemplary embodiment of the present subject matter employing a single current source.

With present reference to FIG. 3, there is illustrated a further exemplary embodiment of the present match-drop circuit 300 employing a single current source. It should first be appreciated that each of the illustrated reference number identified components correspond in function to their respective counterparts as illustrated in FIG. 2 but are here illustrated and labeled using 300 series numbers corresponding identically to the equivalent similarly numbered 200 series components of FIG. 2. Thus, as will be well understood by those of ordinary skill in the art, no additional description of such components are necessary here as such would be redundant.

Comparing the embodiments of FIGS. 2 and 3, however, it will be noted that the FIG. 3 embodiment in general substitutes a single current source (g) 320 for the pair of sources g1, g2 (220, 222) illustrated in FIG. 2. In such FIG. 3 embodiment, any mismatch resulting from the use of two physically different current sources may be avoided by supplying a single current source (g) 320 and switching such source from one branch to the other. Such switching may be accomplished in two phases where in a first phase ganged switches P1 may be closed while ganged switches P2 remain open to connect current source (g) 320 to junction 332 and control voltage over line 342 from Tuning circuit 340 to current source (g) 320 to provide control signals thereto.

In a second phase, ganged switches P1 are opened and ganged switches P2 closed so that current source (g) 320 is coupled to junction point 334 while control voltage is supplied to current source (g) 320 via line 344 from Tuning circuit 340. To protect measurement nodes 332, 334 and meter 330 from being pulled up to the phase voltage on line 304 during the phase where resistors 310, 312 receive no current, zener diodes 352, 354 are connected between junction points 320, 322, respectively, and neutral line 306.

An additional feature of the present technology resides in the potential for use of various high-frequency waveforms as the high-frequency signal v. In accordance with further embodiments of the present subject matter, high-frequency signals may correspond to any type signal including, without limitation, sine wave signals or more complex signals including pseudo-random, square wave, or other type wave forms that are not necessarily periodic with the sole limitation that such signals be out of the electrical current metering bandwidth. Generally such metering bandwidth may correspond to 0-4 kHz to that an appropriate frequency range for high-frequency signal v may correspond to 20 kHz-100 kHz. One aspect of using such waveforms is that use of such reduces the possibility of tampering by external injection of similar signals.

Figure 4:
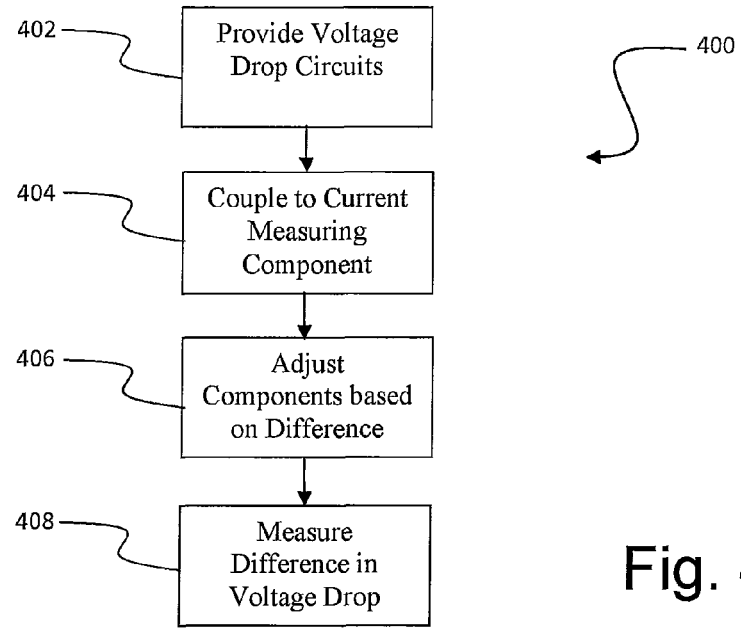
FIG. 4 is a flow chart illustrating matched voltage drop measurement methodologies in accordance with present technology.

With present reference to FIG. 4 there is illustrated a flow chart 400 showing exemplary steps in practicing voltage drop measurement methodologies in accordance with the present subject matter. At step 402 voltage drop circuits are provided depending on the number of measurements to be taken. Generally for a single phase circuit, a pair of voltage drop circuits will be provided but, of course, such number may be increased for polyphase circuits. Exemplary such expansion from single phase to polyphase measurement circuits may be seen in U.S. Pat. No. 7,242,177 to Maier et al., the complete disclosure of which is incorporated herein by reference, for all purposes. The provided voltage divider circuits may generally correspond to a fixed value component and an adjustable value component couple in series. In selected embodiments, the fixed value component may correspond to a fixed value resistor. The adjustable value component may correspond to one or more adjustable current sources.

At optional step 404, if the method is to be used to measure current flow, a pair of voltage divider circuits may be coupled to opposite ends of a current measuring component. In particular exemplary embodiments this step may be accomplished by coupling one end each of a pair of voltage divider circuits to one end each of a fixed small value resistor that may, in turn, be coupled in series with a load device, the current through which may be desired to be determined. In embodiments where the method is applied to provide matched voltage drops in paired voltage drop circuits, one end of each of a pair of voltage drop circuits may be couple to respective points at which the matched drops are to be provided.

At step 406 the adjustable component of the voltage drop circuits is adjusted based on measured differences between the voltage drops. In some embodiments individual adjustable components are used for each of the voltage drop circuits as illustrated, for example, in FIG. 2. In alternative embodiments, a single adjustable component may be use, per illustration in FIG. 3, and configured to be alternately couple as the adjustable component in both (in the case of a pair of circuits) voltage divider circuits. In either instance, in accordance with present methodologies, adjustment to the adjustable component per step 406 may be made by providing an adjustment signal to the (or both) adjustable component(s) so as to reduce differences between the measured voltage drop produced by the voltage drop circuits. That is to say, differences between the voltages measured at the respective junction points of the fixed value and adjustable value components of each of the voltage divider circuits. A significant aspect to such adjustment step 406 is that the adjustment signal includes a high-frequency signal that is higher in frequency than that of any voltage applied to the inputs of each of the voltage drop circuits. Further, the high-frequency signal may be generated using a number of different waveforms including, without limitation, pseudo-random signals, square waves, and sinusoidal waveforms. Advantageously, as previously mentioned herein above, the matching adjustments produced by both the higher and lower frequency components are the same.

Finally, in step 408, a measurement of the difference in voltage drop produced by each of the voltage drop circuits is made measuring the voltage drop based on the frequency of the voltage applied to the input of each of the voltage drop circuits.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for measuring differences in voltage drop, comprising:
   coupling a current measurement component having first and second terminals in series with a voltage source and a load device, the voltage source operating at a line frequency;
   providing first and second voltage drop circuits each comprising a fixed value component and an adjustable value component coupled in series;
   coupling the first voltage drop circuit to the first terminal of the current measurement component;
   coupling the second voltage drop circuit to the second terminal of the current measurement component;
   superimposing a relatively high-frequency signal onto a control input of the adjustable value components;
   adjusting the values of the adjustable value components based on any difference in voltage drop values produced by the first and second voltage drop circuits due to measured variations in the voltage drops produced by the high-frequency signal; and
   measuring the difference in voltage drop produced by the difference in voltage drop values produced by the first and second voltage drop circuits at the line frequency.

2. A method as in claim 1, wherein the current measurement component comprises a resistor.

3. A method as in claim 1, wherein the fixed value component is a resistor.

4. A method as in claim 1, wherein the adjustable value component is an adjustable current source.

5. A method as in claim 1, wherein the adjustable value components correspond to a single adjustable value component selectively connectable to each of the fixed value components.

6. A method as in claim 1, wherein the high-frequency signal is a pseudo random signal.

7. A method as in claim 1, wherein the high-frequency signal is a square wave signal.

8. A method as in claim 1, further including using the measured voltage drop for calculating associated current flow in an associated load.

9. A method as in claim 1, further including using the measured voltage drop in multiple phases of a multi-phase electrical source to be metered, and calculating associated current flow in such corresponding multiple phases in an associated polyphase load.

10. Apparatus for measuring current flow at a first frequency through a load device, comprising:
    a current measurement component having first and second terminals;
    first and second voltage drop circuits coupled, respectively, to the first and second terminals of the current measurement component, each voltage drop circuit including a first fixed value component coupled in series with an adjustable value component;
    a tuning circuit configured to couple a high-frequency signal to a control input of the adjustable value components, to monitor voltage drops produced by said first and second voltage drop circuits from said high-frequency signal, and to provide signals to said adjustable value components based on any differences in the voltage drops; and
    a measurement device coupled to the first and second voltage drop circuits to measure voltage drop differences at said first frequency.

11. Apparatus for measuring current flow at a first frequency through a load device, comprising:
    a current measurement component having first and second terminals;
    first and second fixed value components connected, respectively, to said first and second terminals of the current measurement component;
    an adjustable value component;
    a switching device, the switching device configured to connect each fixed value device to said adjustable value component so that the first and second fixed value components are alternately coupled in series with said adjustable value component;

a tuning circuit configured to couple a high-frequency signal to a control input of the adjustable value component, to monitor voltage drops produced by said first and second fixed value components when coupled in series with said adjustable value component from said high-frequency signal, and to a provide signals to said adjustable value component based on any differences in the voltage drops; and a measurement device coupled to the first and second fixed value components to measure voltage drop differences at said first frequency.

12. Apparatus as in claim 11, wherein said switching device comprises ganged switches.

13. A method for measuring current flow, comprising:

measuring a current across a current sensing component having first and second terminals in series with a voltage source and a load device, the voltage source operating at a line frequency;

measuring a voltage difference between first and second voltage drop circuits, each voltage drop circuit comprising a fixed value component and an adjustable value component coupled in series, wherein:

the first voltage drop circuit is coupled to the first terminal of the current measurement component; and the second voltage drop circuit is coupled to the second terminal of the current measurement component;

superimposing a signal onto a control input of the adjustable value components;

measuring variations in voltage between the first and second voltage drop circuits based on the signal; and adjusting values of the adjustable value components based at least in part on the measured variations;

wherein the measuring of the current across the current sensing component comprises measuring a difference in voltage drop between the first and second voltage drop circuits at the line frequency.

14. A method as in claim 13, wherein the current sensing component comprises a current sensing resistor.

15. A method as in claim 13, wherein the fixed value component of each of the first and second voltage drop circuits comprises a resistor.

16. A method as in claim 13, wherein the adjustable value component comprises an adjustable current source.

17. A method as in claim 13, wherein adjusting the values of the adjustable components is performed by a tuning circuit.

18. A method as in claim 13, wherein the signal is a pseudo random signal.

19. A method as in claim 13, wherein the signal is a square wave signal.

20. A method as in claim 13, wherein the adjusting of the values of the adjustable value components compensates for differences in values of the fixed value components.

21. A method as in claim 13, wherein the measuring of the current across the current sensing component is performed for each phase of a poly-phase load.

\* \* \* \* \*